(12) United States Patent
Komiya et al.

(10) Patent No.: US 11,982,687 B2
(45) Date of Patent: May 14, 2024

(54) IC CHIP HOLDER

(71) Applicant: BROTHER KOGYO KABUSHIKI KAISHA, Nagoya (JP)

(72) Inventors: Hidekazu Komiya, Nagoya (JP); Koji Hayashi, Motosu (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 0 days.

(21) Appl. No.: 17/896,816

(22) Filed: Aug. 26, 2022

(65) Prior Publication Data

US 2022/0413011 A1 Dec. 29, 2022

Related U.S. Application Data

(63) Continuation of application No. 16/752,206, filed on Jan. 24, 2020, now Pat. No. 11,499,991.

(30) Foreign Application Priority Data

Jan. 31, 2019 (JP) ................................ 2019-016398

(51) Int. Cl.
*G01R 1/04* (2006.01)
*H01L 23/32* (2006.01)
(52) U.S. Cl.
CPC ............ *G01R 1/0483* (2013.01); *H01L 23/32* (2013.01)
(58) Field of Classification Search
CPC .............................. G01R 1/0483; H01L 23/32
See application file for complete search history.

(56) References Cited

U.S. PATENT DOCUMENTS

| 5,420,840 | A | 5/1995 | Bec |
| 6,006,987 | A | 12/1999 | Hoolhorst |
| 2006/0194479 | A1 | 8/2006 | Osako et al. |
| 2012/0200871 | A1 | 8/2012 | Takahashi et al. |
| 2013/0188985 | A1 | 7/2013 | Takahashi et al. |
| 2013/0223877 | A1 | 8/2013 | Takahashi et al. |
| 2014/0037325 | A1 | 2/2014 | Takahashi et al. |

(Continued)

FOREIGN PATENT DOCUMENTS

| CN | 1840346 A | 10/2006 |
| CN | 201456559 U | 5/2010 |

(Continued)

OTHER PUBLICATIONS

Extended European Search Report (EESR) dated Apr. 21, 2020 in corresponding European Patent Application No. 20153440.1.

(Continued)

*Primary Examiner* — Paresh Patel
(74) *Attorney, Agent, or Firm* — K&L Gates LLP

(57) ABSTRACT

The present disclosure relates to an IC chip holder capable of alleviating an impact if the IC chip holder is dropped or collides with another object. In the IC chip holder, an upper housing body is provided, on a side of electric contacts of an IC chip, with an elastic deformation portion capable of elastically deforming toward the inside of the upper housing body. Thus, since the elastic deformation portion elastically deforms toward the inside of the upper housing body, if the IC chip holder is dropped or collides with another object, the elastic deformation portion bends and the impact is alleviated. Thus, a possibility of the IC chip being damaged is reduced.

11 Claims, 16 Drawing Sheets

(56) References Cited

U.S. PATENT DOCUMENTS

| | | | |
|---|---|---|---|
| 2014/0286670 A1 | 9/2014 | Takahashi et al. | |
| 2014/0314443 A1 | 10/2014 | Takahashi et al. | |
| 2014/0341602 A1 | 11/2014 | Takahashi et al. | |
| 2015/0037050 A1 | 2/2015 | Kimura et al. | |
| 2015/0197094 A1 | 7/2015 | Ogawa et al. | |
| 2015/0293485 A1 | 10/2015 | Takahashi et al. | |
| 2017/0066248 A1 | 3/2017 | Ono | |
| 2017/0153572 A1 | 6/2017 | Takahashi et al. | |
| 2017/0280579 A1* | 9/2017 | Tan | H05K 7/1461 |
| 2017/0282583 A1 | 10/2017 | Okazaki et al. | |
| 2018/0253028 A1 | 9/2018 | Takahashi et al. | |
| 2019/0001694 A1 | 1/2019 | Okazaki et al. | |
| 2020/0026220 A1 | 1/2020 | Takahashi et al. | |
| 2020/0348615 A1 | 11/2020 | Takahashi et al. | |

FOREIGN PATENT DOCUMENTS

| | | |
|---|---|---|
| CN | 202965517 U | 6/2013 |
| CN | 203157377 U | 8/2013 |
| CN | 104076672 A | 10/2014 |
| CN | 106210206 A | 12/2016 |
| CN | 107264041 A | 10/2017 |
| CN | 207011171 U | 1/2018 |
| CN | 207766738 U | 8/2018 |
| EP | 1271397 A2 | 1/2003 |
| EP | 2050573 A2 | 4/2009 |
| EP | 3260298 A1 | 12/2017 |
| EP | 3498477 A1 | 6/2019 |
| JP | S55-087683 U | 6/1980 |
| JP | S60-070999 U | 5/1985 |
| JP | H06-103593 A | 4/1994 |
| JP | H10187897 A | 7/1998 |
| JP | 2000-006440 A | 1/2000 |
| JP | 2010044926 A | 2/2010 |
| JP | 2015-045832 A | 3/2015 |
| JP | 2015-134430 A | 7/2015 |
| JP | 5962368 B2 | 8/2016 |
| WO | 2018028411 A1 | 2/2018 |

OTHER PUBLICATIONS

Chinese Office Action dated Dec. 30, 2020 in corresponding Chinese Patent Application No. 202010073926.9.
European Office Communication dated Feb. 25, 2021 in corresponding European Patent Application No. 20153440.1.
Chinese Office Action dated Aug. 23, 2021 in corresponding Chinese Patent Application No. 202010073926.9.
Japanese Office Action, dated Feb. 15, 2022, in corresponding Japanese Application No. 2019-016398 (6 pages).
Office Action issued in corresponding European patent application No. 20153440.1, dated Sep. 21, 2022. (4 pages.).

* cited by examiner

IC CHIP HOLDER

CROSS-REFERENCE TO RELATED APPLICATION

This application is a continuation of U.S. patent application Ser. No. 16/752,206, filed on Jan. 24, 2020, which application claims priority to Japanese Patent Application No. 2019-16398, filed Jan. 31, 2019. The contents of the foregoing application are hereby incorporated herein by reference.

BACKGROUND

The present disclosure relates to an IC chip holder in which an IC chip is mounted.

A memory cartridge is known that stores, inside a housing body, a circuit board including a storage element such as a ROM or the like. For example, in a memory cartridge, an engagement protrusion is formed on an inner surface of a side wall of a housing body. A tab, which can be elastically deformed and which engages with the engagement protrusion, is provided on a circuit board, and the circuit board is fixed inside the housing body. Further, a connector is known that causes contact portions of a circuit board stored inside a housing body and a jack portion to be fitted with each other. For example, in a connector, a tab of a fixing arm on a side surface of a housing body storing a circuit board engages from the inside of a hole of the jack portion, and the circuit board and the jack portion are held in a stable contact state.

SUMMARY

However, if the above-described known memory cartridge and connector are dropped or collide with another object, the impact is not alleviated, and there is a possibility that the circuit board may be damaged.

Embodiments of the broad principles derived herein provide an IC chip holder that can alleviate an impact if the IC chip holder is dropped or collides with another object.

An IC chip holder according to the present disclosure includes an IC chip provided with an electric contact, and a housing body in which the IC chip is mounted. The housing body includes, on the side of the electric contact, an elastic deformation portion configured to elastically deform toward the inside of the housing body. The elastic deformation portion elastically deforms toward the inside of the housing body, and thus, if the IC chip holder is dropped or collides with another object, the elastic deformation portion bends and alleviates the impact. Thus, a possibility of the IC chip being damaged is reduced.

BRIEF DESCRIPTION OF THE DRAWINGS

Embodiments will be described below in detail with reference to the accompanying drawings in which.

DETAILED DESCRIPTION

An embodiment of the present disclosure will be explained with reference to the drawings. An overall configuration of a printer 1 will be explained with reference to FIG. 1. The upward direction, the downward direction, the downward left direction, the upward right direction, the downward right direction, and the upward left direction of FIG. 1 are, respectively, the upper side, the lower side, the front side, the rear side, the right side, and the left side of the printer 1.

Structure of Printer 1

Figure 1:
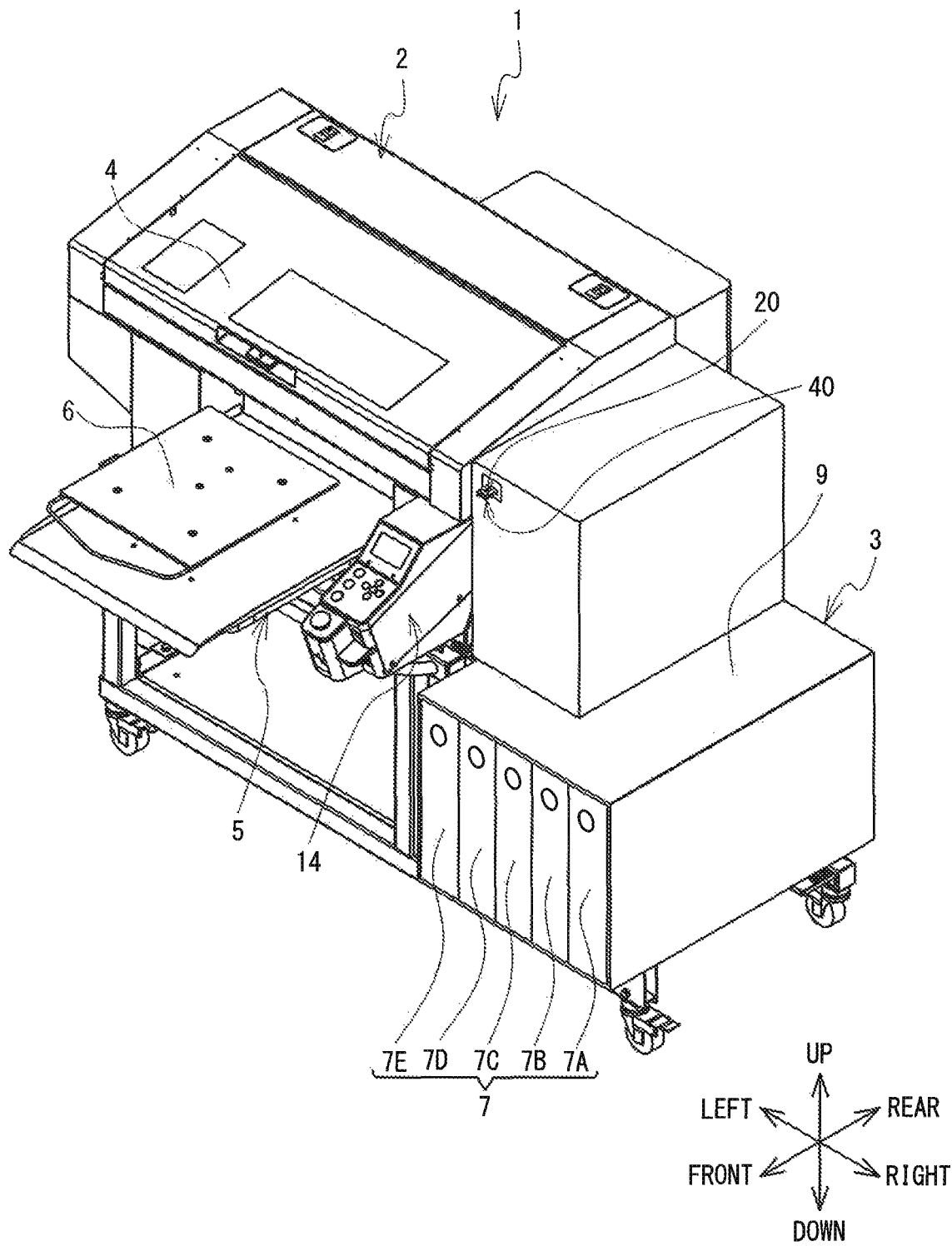
FIG. 1 is a perspective view of a printer 1.

As shown in FIG. 1, the printer 1 is an inkjet printer that performs printing by ejecting liquid ink onto a print medium (not shown in the drawings). The main print medium of the printer 1 is a cloth, such as a T-shirt or the like or paper or the like. The printer 1 prints a color image on the print medium by downwardly ejecting five types of mutually different inks (white (W), black (K), yellow (Y), cyan (C), and magenta (M). In the following explanation, of the five types of ink, the white ink is referred to as white ink, and when the four colors of ink (black, cyan, yellow, and magenta) are collectively referred to, they are referred to as color inks. When the white ink and the color inks are collectively referred to, or when it is not specified which of the inks is being referred to, they are referred to simply as ink or inks.

As shown in FIG. 1, the printer 1 is provided with a main body portion 2 and a tank mounting unit 3. The main body portion 2 is provided with a housing body 4. A platen 6, and a platen drive mechanism 5 are provided in the center, in the left-right direction, of the main body portion 2. The platen drive mechanism 5 is provided with a pair of guide rails (not shown in the drawings). The pair of guide rails extend in the front-rear direction on the inside of the platen drive mechanism 5, and support the platen 6 such that the platen 6 can move in the front-rear direction. The platen drive mechanism 5 moves the platen 6 along the pair of guide rails in the front-rear direction, using, a motor (not shown in the drawings) provided in a rear end portion. The platen 6 is plate-shaped having a substantially rectangular shape in a plan view. The platen 6 holds, on an upper surface thereof, the print medium that is the cloth such as the T-shirt or the like.

An operation portion 14 is provided in a lower right portion of the front surface of the main body portion 2. The operation portion 14 has a display, and buttons or the like. The tank mounting unit 3 is a portion used to mount a tank 7 that supplies liquid to a print head 13. The tank mounting unit 3 is provided on the right side of the main body portion 2. A total of five of the tanks 7 can be mounted on the tank mounting unit 3. Normally, the five tanks 7 include a tank 7A for the white ink, a tank 7B for the cyan ink, a tank 7C for the magenta ink, a tank 7D for the yellow ink, and a tank 7E for the black ink. Each of the tanks 7 is respectively provided with a remaining amount of ink sensor (not shown in the drawings). The main body portion 2 is provided with a print head (not shown in the drawings) that ejects the white ink, and print heads (not shown in the drawings) that eject the cyan, magenta, yellow, and black inks, the print heads moving in the left-right direction inside the main body portion 2.

An ink tank control portion 9 is provided on the tank mounting unit 3. A control circuit configured by a CPU, a RAM, a ROM, and the like that are not shown in the drawings is provided in the ink tank control portion 9. A chip writer 20 is provided on the tank mounting unit 3. An IC chip holder 40 to be described later can be removably inserted into the chip writer 20. The IC chip holders 40 are individually attached, in a one-to-one correspondence, to ink storage containers (not shown in the drawings) used to fill each of the tanks 7 with the ink. When the user fills any one of the tanks 7 with the ink, the IC chip holder 40 is inserted into the chip writer 20.

Structure of Chip Writer 20

Figure 2:
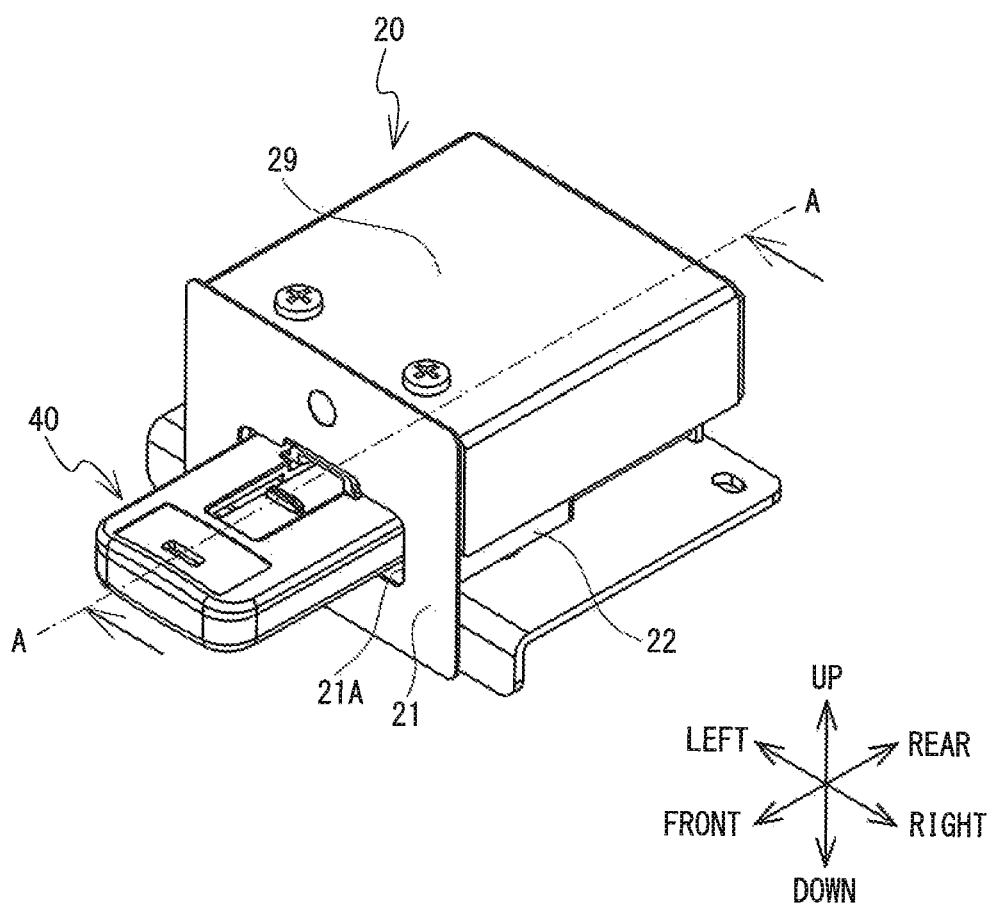
FIG. 2 is a perspective view of a chip writer 20.
Figure 3:
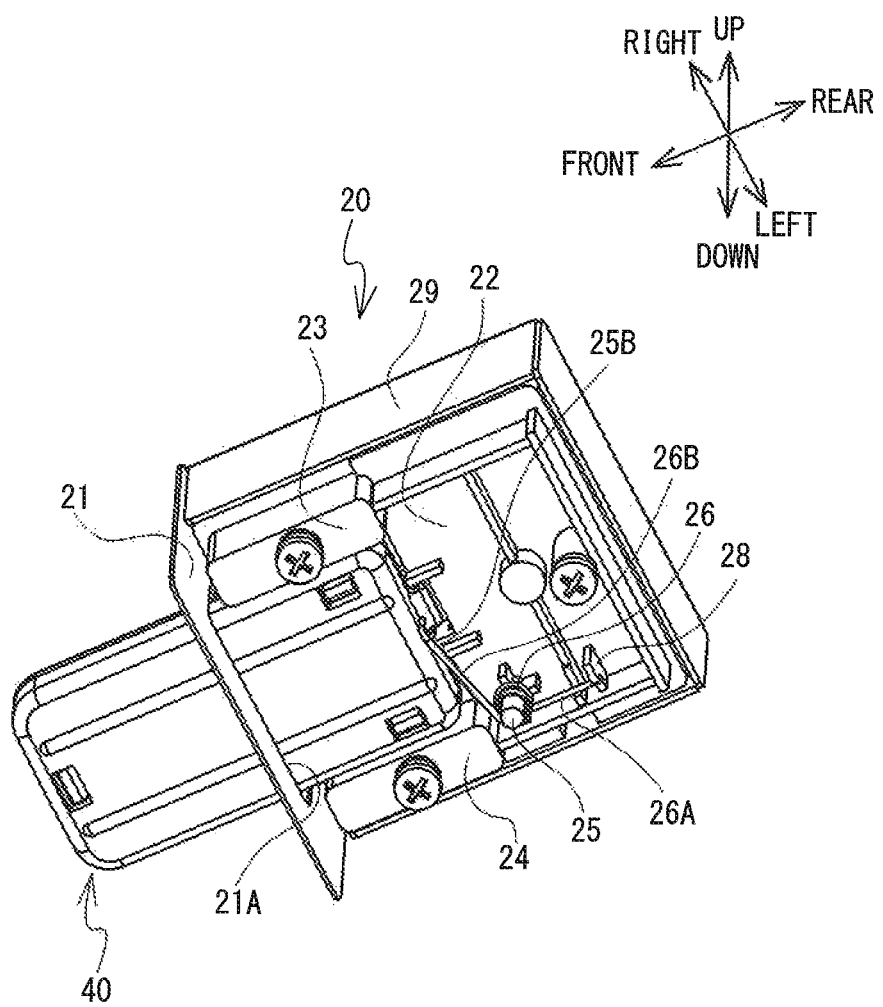
FIG. 3 is a perspective view of a bottom side of the chip writer 20.
Figure 4:
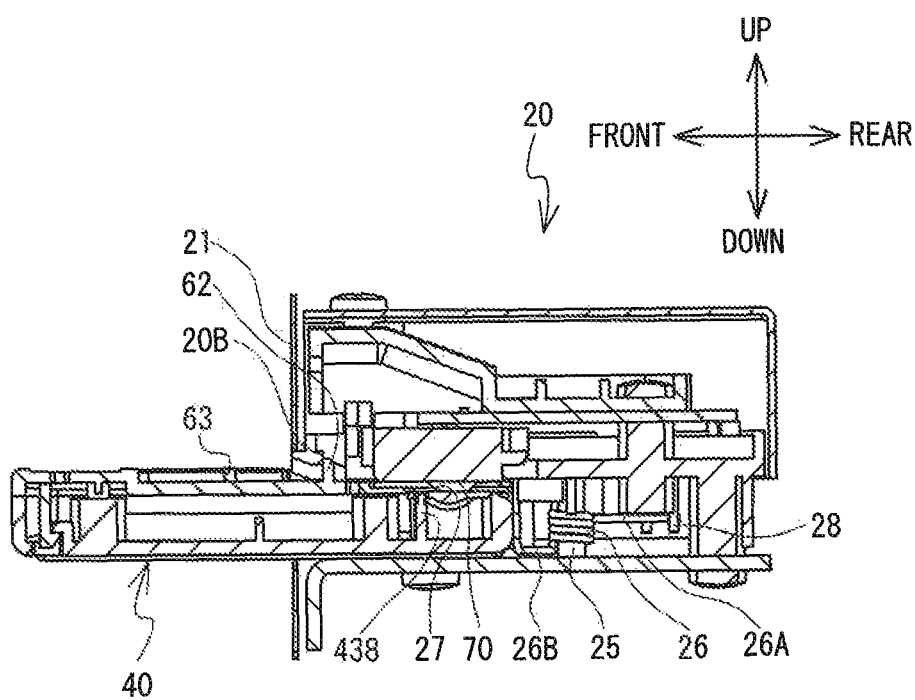
FIG. 4 is a cross-sectional view as seen in the direction of arrows along a line A-A in FIG. 2.

The structure of the chip writer 20 will be explained with reference to FIG. 2 to FIG. 4. As shown in FIG. 2, the chip writer 20 has a substantially cuboid shaped housing body 29. A rectangular shaped front surface plate 21 is provided on the front surface of the housing body 29. A substantially rectangular opening 21A that is horizontally long is formed in the front surface plate 21. The IC chip holder 40 can be inserted into the opening 21A. As shown in FIG. 4, an engagement portion 20B is provided inside the opening 21A, and a protrusion 62 of an elastic deformation portion 60 of the IC chip holder 40 to be described later is engaged with the engagement portion 20B. As shown in FIG. 3, the chip writer 20 is provided with a frame 22, a guide member 23 is provided on the right side of the frame 22. A guide member 24 is provided on the left side of the frame 22. The guide member 23 and the guide member 24 guide the IC chip holder 40 in the insertion direction. The frame 22 is provided with a shaft 25. A torsion spring 26 is mounted on the shaft 25, a first end portion 26A of the torsion spring 26 is engaged with an engagement portion 28 on the frame 22, and a second end portion 26B of the torsion spring 26 comes into contact with the rear end portion of the inserted IC chip holder 40. Thus, the second end portion 26B of the torsion spring 26 urges the IC chip holder 40 inserted into the chip writer 20 in the direction opposite to the insertion direction. Via an electric contact 27 that is a plate shaped flexible body, the chip writer 20 writes information relating to the ink into an IC chip 70 (refer to FIG. 5 and FIG. 6) of the inserted IC chip holder 40.

Structure of IC Chip Holder 40

The structure of the IC chip holder 40 will be explained with reference to FIG. 5 to FIG. 14. The IC chip holder 40 is provided with an upper housing body 41 and a lower housing body 42. The IC chip holder 40 is a cuboid shaped with chamfered corners. The upper housing body 41 and the lower housing body 42 are made of a synthetic resin, for example. The IC chip holder 40 is longer in the front-rear direction than in the left-right direction, and is shorter in the up-down direction than in the left-right direction. The IC chip holder 40 is provided with a top surface 43, a bottom surface 44, a front surface 47, a back surface 48, a left side surface 45, and a right side surface 46.

Figure 5:
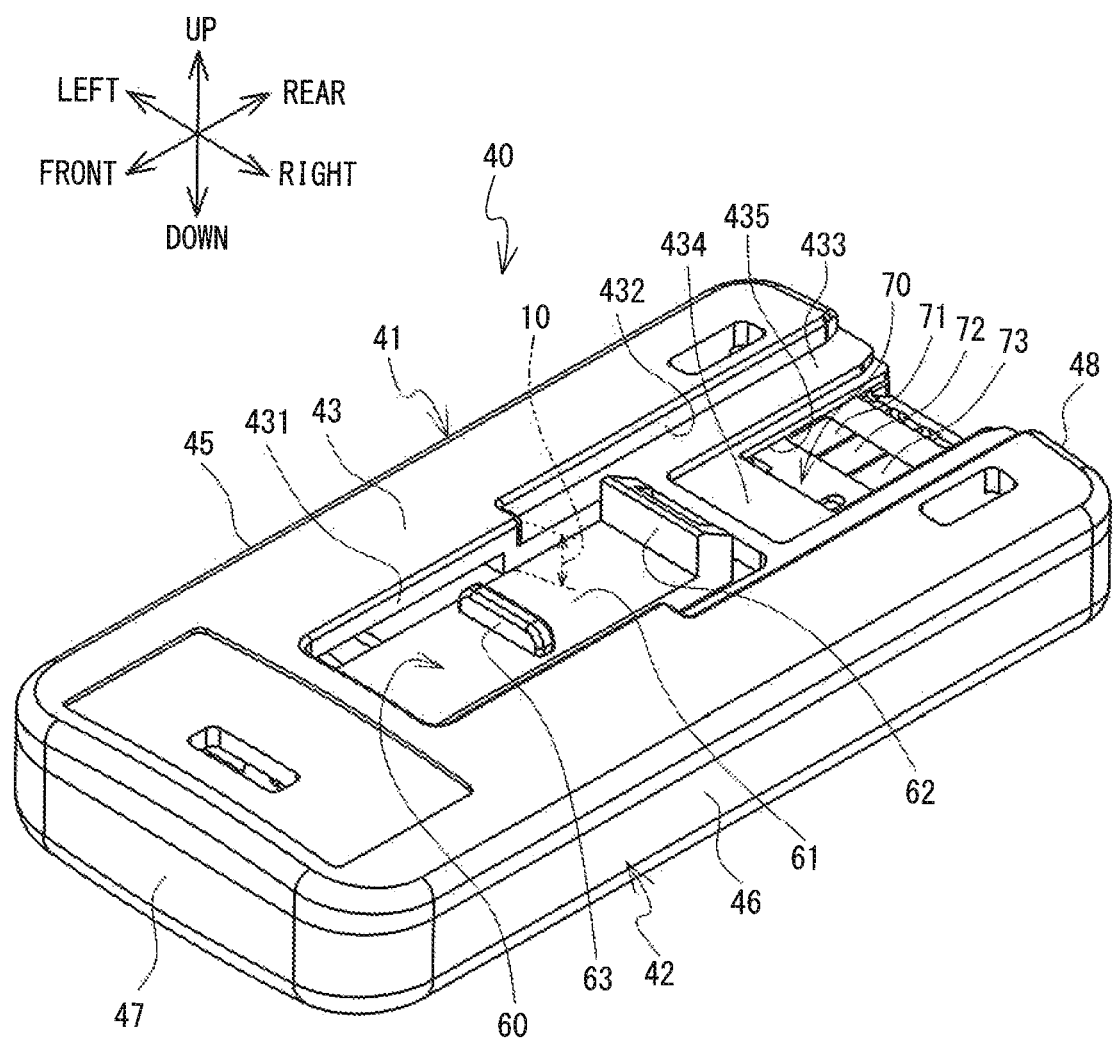
FIG. 5 is a perspective view of an IC chip holder 40.
Figure 6:
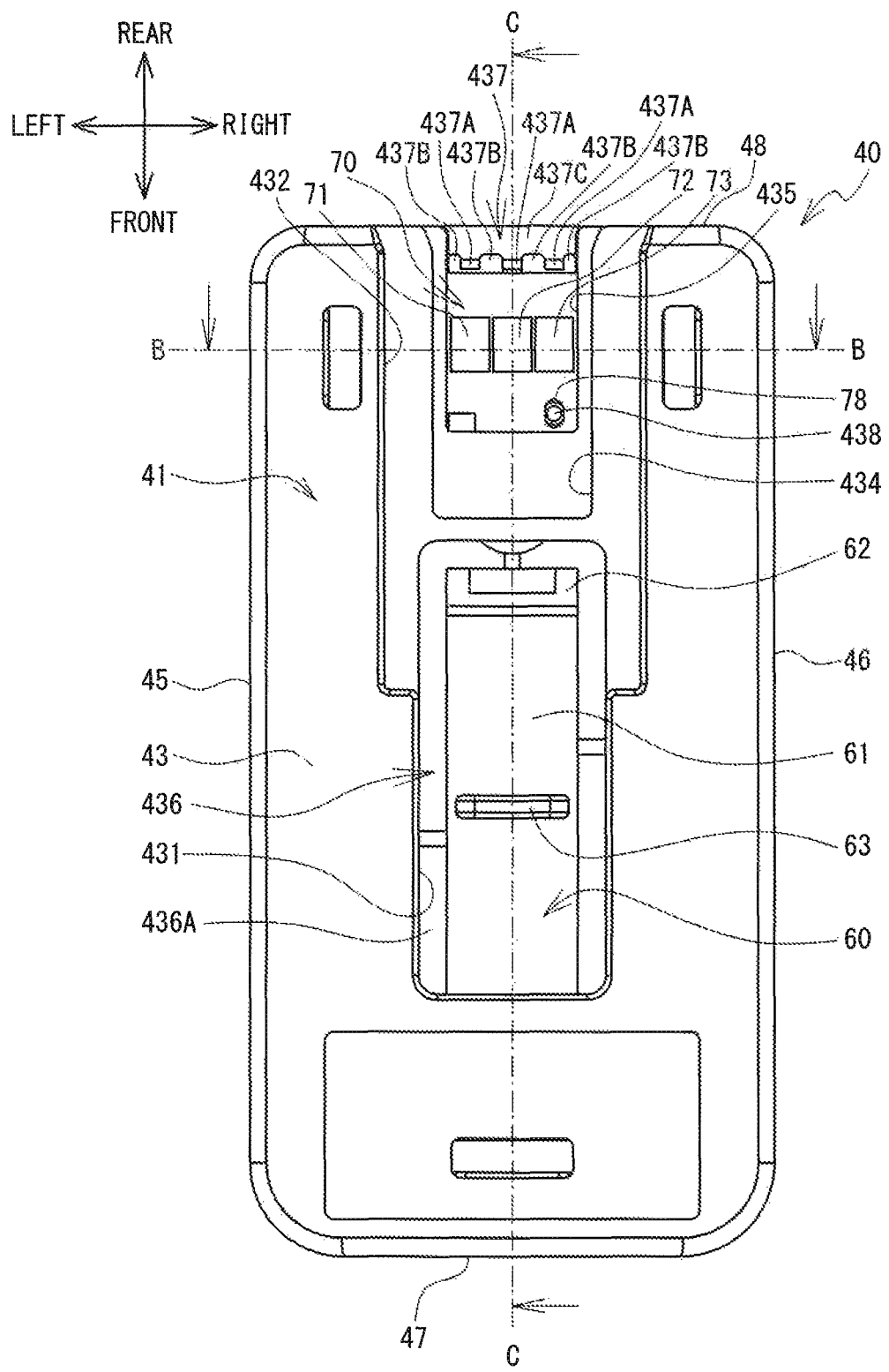
FIG. 6 is a plan view of the IC chip holder 40.
Figure 10:
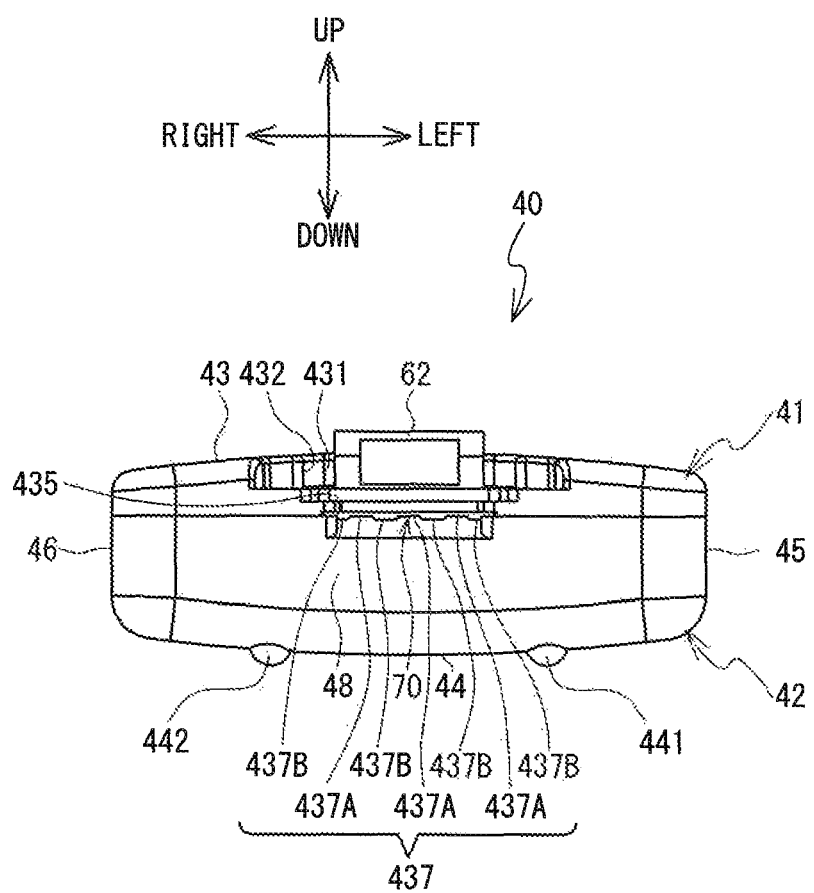
FIG. 10 is a rear side view of the IC chip holder 40.
Figure 11:
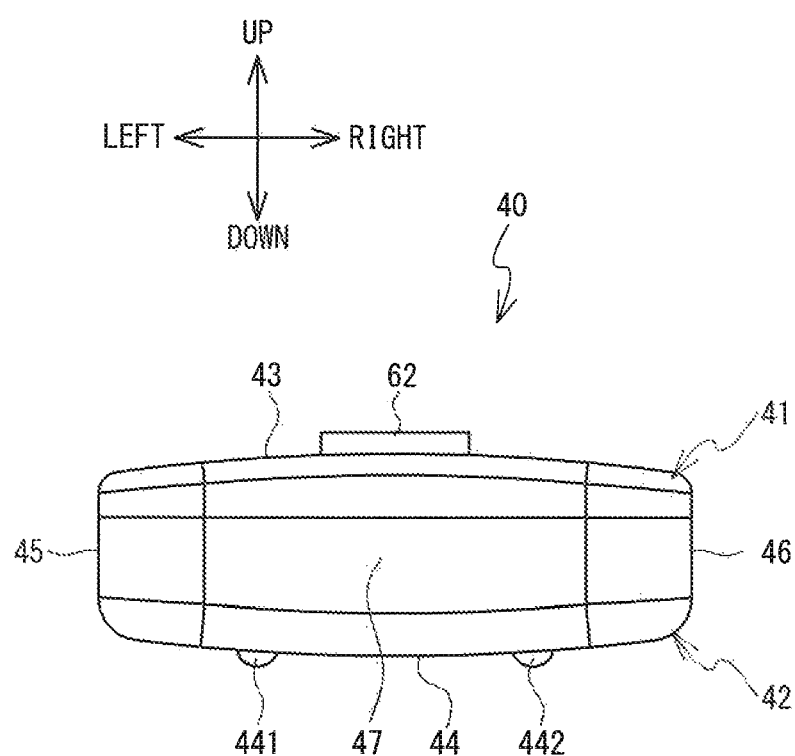
FIG. 11 is a front view of the IC chip holder 40.

The top surface 43 is surface of the upper housing body 41 excluding a first recessed portion 431, a second recessed portion 432, a third recessed portion 434, a elastic deformation portion 60, a protrusion 62, and recessed portions 431 to 435, and extends in the front-rear direction. As shown in FIG. 10 and FIG. 11, the top surface 43 is curved in the left-right direction. As shown in FIG. 5 and FIG. 6, a first recessed portion 431 to be described later and that is recessed toward the bottom surface 44 is formed in a central portion of the top surface 43 closer to the front surface 47. In a plan view, the first recessed portion 431 is a substantially rectangular shape that is long in the front-rear direction. Further, a second recessed portion 432 is formed toward the back surface 48 from the rear end side of the first recessed portion 431. In a plan view, the second recessed portion 432 is a substantially rectangular shape that is long in the front-rear direction. In the left-right direction, the width of the second recessed portion 432 is wider than the width of the first recessed portion 431. Further, a third recessed portion 434 is provided inside the second recessed portion 432. In a plan view, the third recessed portion 434 is a substantially rectangular shape that is long in the front-rear direction. Further, a cut-out portion 435 is formed inside the third recessed portion 434. In a plan view, the cut-out portion 435 is a substantially rectangular shape that is long in the front-rear direction. The rear end side of the cut-out portion 435 reaches the back surface 48. The IC chip 70 is mounted in the cut-out portion 435.

Figure 15:
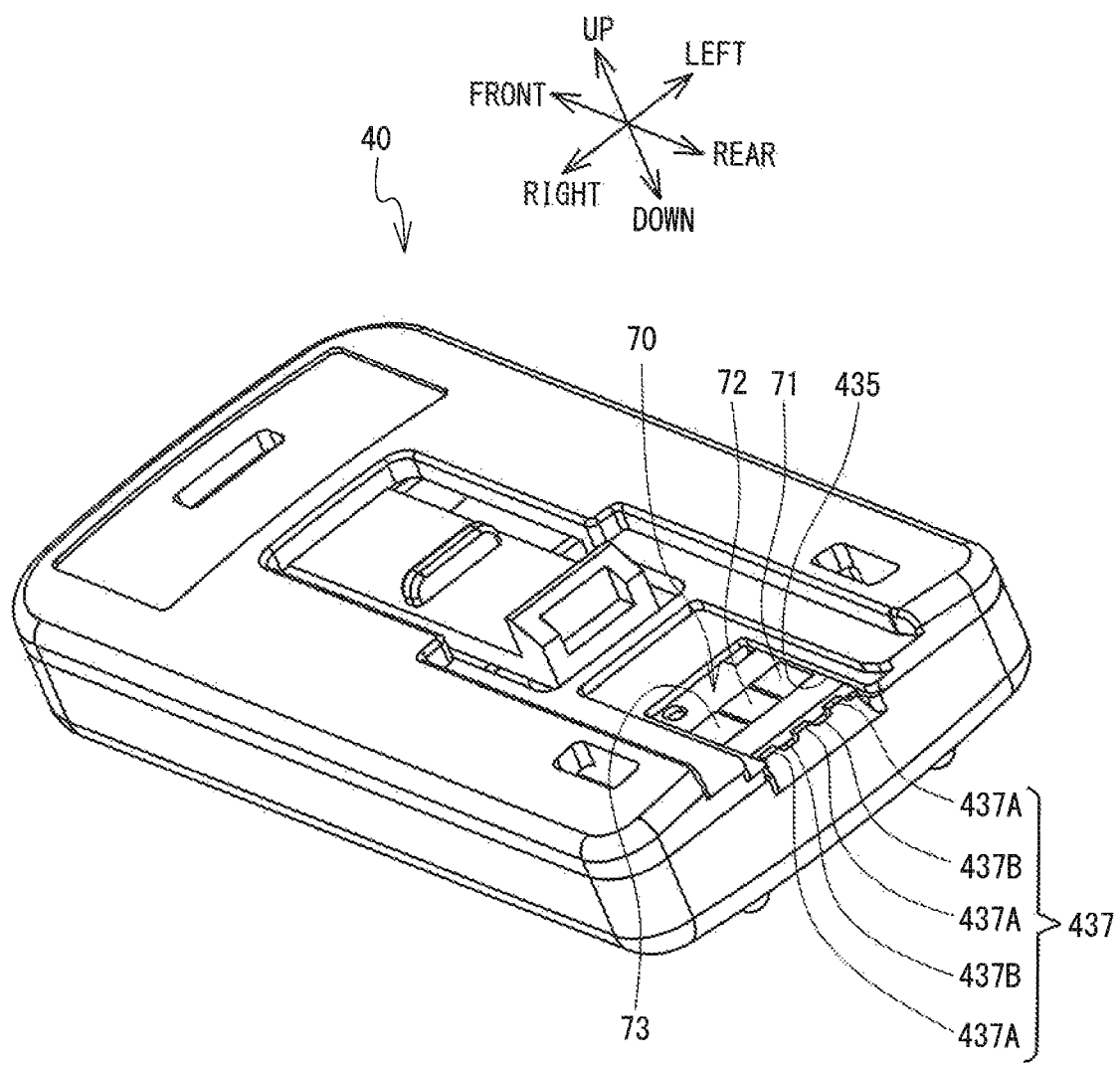
FIG. 15 is a perspective view of the IC chip holder 40.

As shown in FIG. 6 and FIG. 15, a guide portion 437 is provided to the rear of the IC chip 70 of the cut-out portion 435. The guide portion 437 has inclined portions 437C that are surfaces inclined downward from the front side toward the rear side. The upper end of the guide 437 has three protrusion portions 437A and five cut-out portions 437B. The cut-out portions 437B are portion where the upper end of the guide portion 437 are cut out. The protrusion portions 437A and the cut-out portions 437B are arranged alternately alongside each other in the left-right direction. The three protrusion portions 437A are provided in the rear side of each of electric contacts 71, 72, and 73. The cut-out portions 437B are recessed downward. The rear end portions of the protrusion portions 437A are higher than the cut-out portions 437B. The protrusion portions 437A are provided so as to correspond to electrodes on a main body side that are arranged when the IC chip holder 40 is inserted. When the IC chip holder 40 is inserted, the protrusion portions 437A come into contact with the electric contact 27 of the chip writer 20 in advance of the electric contacts 71, 72, and 73, and guide the electric contacts 71, 72, and 73. As a result of the guiding by the protrusion portions 437A, the insertion of the IC chip holder 40 can be performed smoothly.

Figure 13:
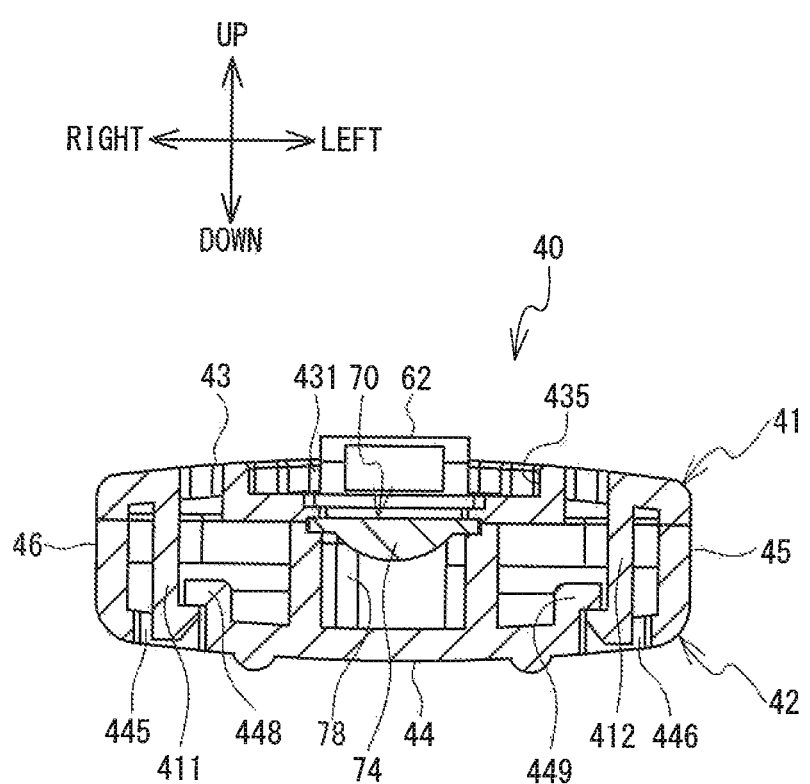
FIG. 13 is a cross-sectional view as seen in the direction of arrows along a line B-B in FIG. 6.
Figure 14:
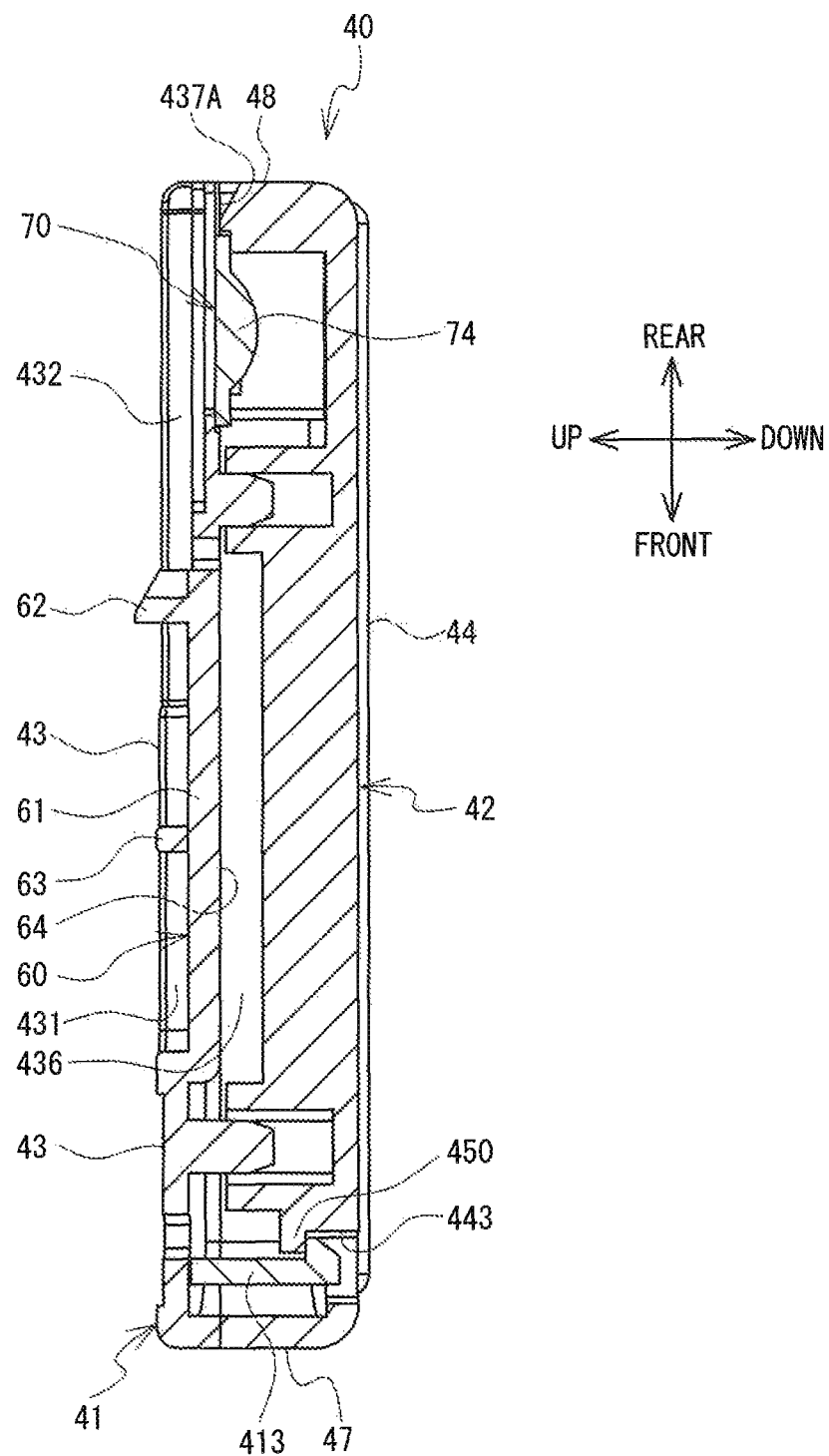
FIG. 14 is a cross-sectional view as seen in the direction of arrows along a line C-C in FIG. 6.

The electric contacts 71, 72, and 73 are provided on the upper surface side of the IC chip 70. As shown in FIG. 13 and FIG. 14, an IC 74 is provided on the lower surface side of the IC chip 70. The electric contacts 71, 72, and 73 are connected to a circuit in the IC chip 70. The IC chip 70 stores the information relating to the ink. For example, the IC chip 70 stores ink color information, a remaining amount of ink in the tank 7, and the like. As shown in FIG. 6, through hole 78 is provided in the IC chip 70, penetrating the IC chip 70 in the up-down direction. When seen from the up-down direction, an opening of the through hole 78 has an elliptical shape in which the end portions in the front-rear direction are semi-circles, and the semi-circles are connected by straight lines. A pin 438 that is provided standing in the up-down direction from an inner surface of the bottom surface 44 is inserted into the through-hole 78, and the through-hole 78 is used to determine the position of the IC chip 70 with respect to the lower housing body 42 at a time of manufacture. In the up-down direction, the upper end of the pin 438 is at the same height as, or is lower than, the upper surface of the IC chip 70, and the upper end of the pin 438 does not protrude from the IC chip 70. The width of the cut-out portion 435 in the left-right direction is narrower than the width of the IC chip 70 in the left-right direction, and the IC chip 70 is sandwiched between the upper housing body 41 and the lower housing body 42. The pin 438 is inserted through the through hole 78. Thus, the IC chip 70 cannot easily fall out of the IC chip holder 40.

As shown in FIG. 5, FIG. 6 and FIG. 14, the elastic deformation portion 60 is provided inside the first recessed portion 431. The elastic deformation portion 60 is provided with a base portion 61, the protrusion 62, and a second protrusion 63. In a plan view, the base portion 61 is a rectangular plate shape that is long in the front-rear direction and that has a predetermined thickness. The front end side of the base portion 61 is connected to a rear side of the top surface 43 of the upper housing body 41. Namely, the upper housing body 41 supports the base portion 61 in a cantilever manner. There is a level difference 10 (refer to FIG. 5) with the upper surface of the base portion 61 and the top surface 43. Further, the base portion 61 is a plate-shaped member made of the same synthetic resin as the upper housing body 41. Since the base portion 61 is cantileveredly supported, it can be elastically deformed. Thus, elastic deformation portion 60 is elastically deformable inside the upper housing body 41. Namely, the elastic deformation body 60 is elastically deformable downward from the position of the top surface 43 of the upper housing body 41. The base portion 61 is positioned to the lower side than the highest position of the top surface 43 in the upper direction of the upper housing body 41. The protrusion 62 is provided on the rear end portion of the base portion 61. The protrusion 62 protrudes upward from the base portion 61 over the left-right direction, and the upper surface of the protrusion 62 is inclined toward the rear end thereof. For example, the upper surface of the protrusion 62 protrudes further outward in the upward direction than the highest position of the top surface 43. In the front-rear direction of the upper housing body 41, the protrusion 62 is disposed further to a central side of the upper housing body 41 than the electric contacts 71 to 73. Further, as shown in FIG. 14, the elastic deformation portion 60 is provided with a bottom surface 64. There is a space 436 on the bottom surface 64 side of the elastic deformation portion 60. The space 436 extends in the left-right direction and the front-rear direction on the bottom surface 64 side of the elastic deformation portion 60. Thus, the elastic deformation portion 60 is provided on the upper housing body 41 with the space 436 between the bottom surface 64 and the lower housing body 42. As shown in FIG. 6, when the upper housing body 41 is viewed in the up-down direction, at least a part 436A of the space 436 is surrounded by the top surface 43. Namely, the surface 43 surrounds at least a part 436A of the space 436 exposed between the surface 43 and the elastic deformation portion 60.

The second protrusion 63 is provided closer to a front end portion than the center of the base portion 61 in the front-rear direction. The second protrusion 63 protrudes upward from the base portion 61 over the left-right direction. Thus, the second protrusion 63 protrudes in the same direction as the protrusion 62. The upper surface of the second protrusion 63 is substantially horizontal, and, protrudes slightly further outward in the upward direction than the top surface 43, for example.

Figure 7:
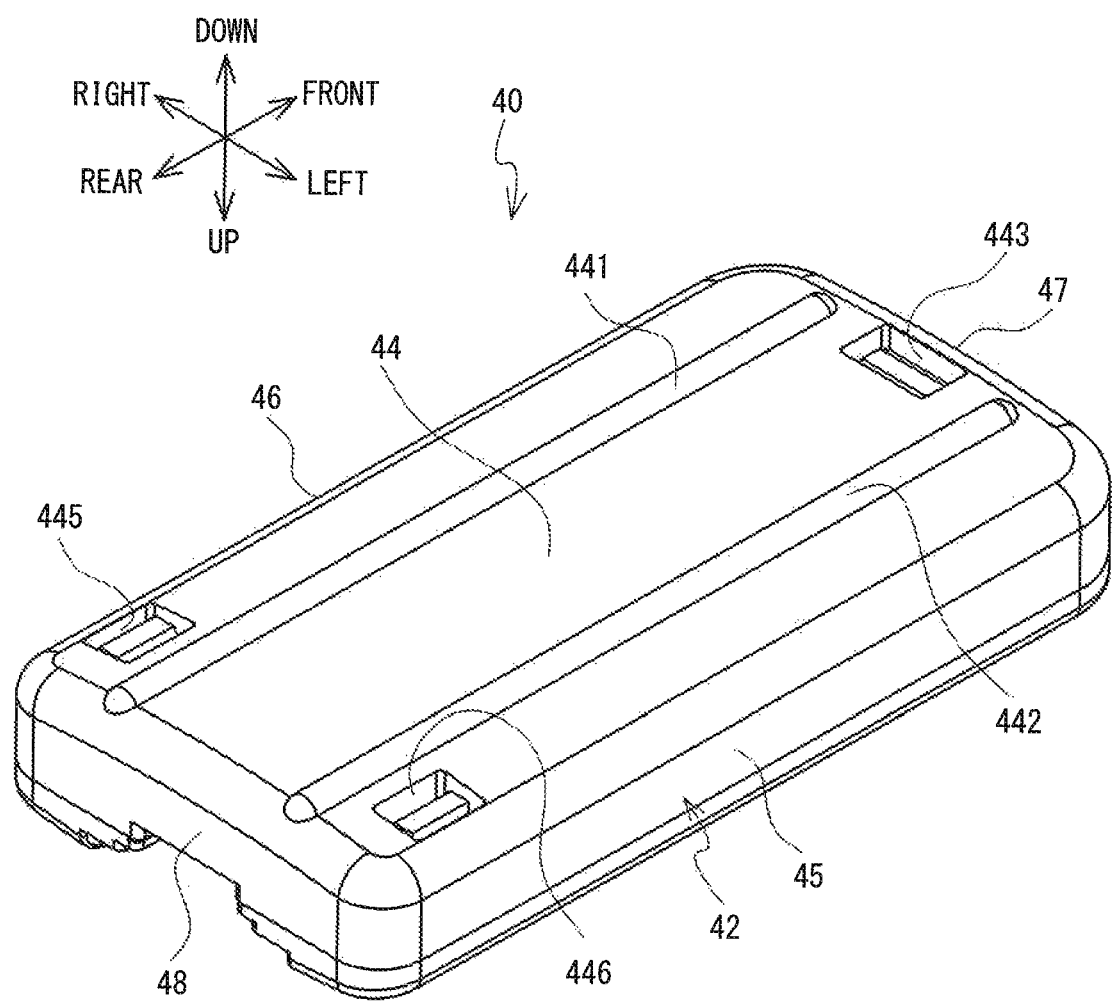
FIG. 7 is a perspective view of the IC chip holder 40 as seen from the bottom side.
Figure 12:
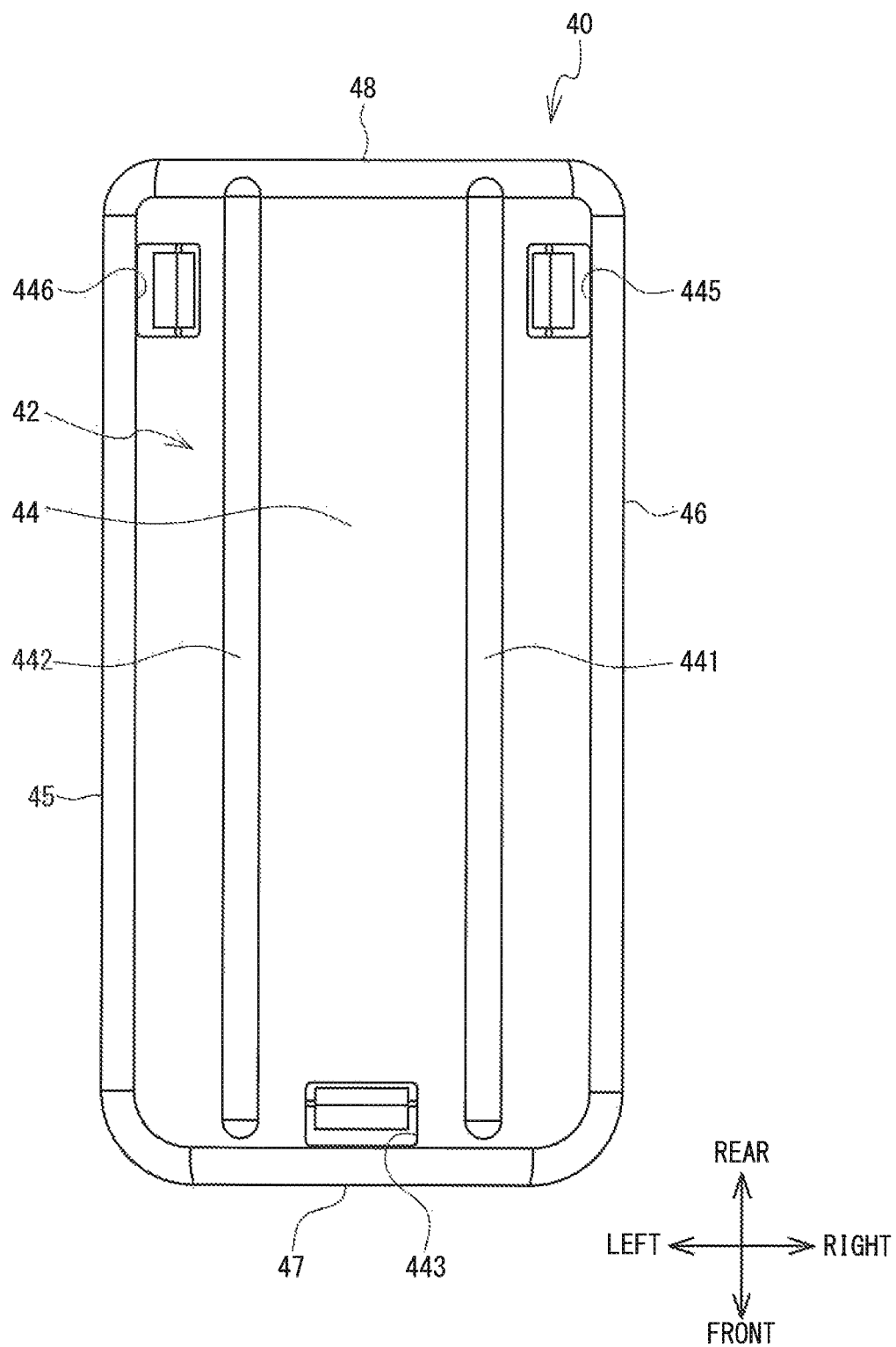
FIG. 12 is a bottom view of the IC chip holder 40.

As shown in FIG. 7 and FIG. 12, the bottom surface 44 is formed on the lower side of the lower housing body 42. In a plan view, the bottom surface 44 is a substantially rectangular shape that is long in the front-rear direction. As shown in FIG. 10, FIG. 11, and FIG. 13, the bottom surface 44 is curved in the left-right direction. A pair of ribs 441 and 442 that extend in the front-rear direction are formed on the bottom surface 44. Further, engagement holes 445 and 446 are provided on the left and right on the back surface 48 side of the bottom surface 44. As shown in FIG. 13, an engagement tab 411 that extends downward inside the upper housing body 41 engages with an engagement receiving portion 448 of the lower housing body 42 inside the engagement hole 445. An engagement tab 412 engages with an engagement receiving portion 449 of the lower housing body 42 inside the engagement hole 446. As shown in FIG. 12, an engagement hole 443 is provided in the center of the bottom surface 44 on the front surface 47 side. As shown in FIG. 14, an engagement tab 413 that extends downward inside the upper housing body 41 engages with an engagement receiving portion 450 of the lower housing body 42 inside the engagement hole 443. Thus, the upper housing body 41 and the lower housing body 42 are integrated with each other.

Figure 8:
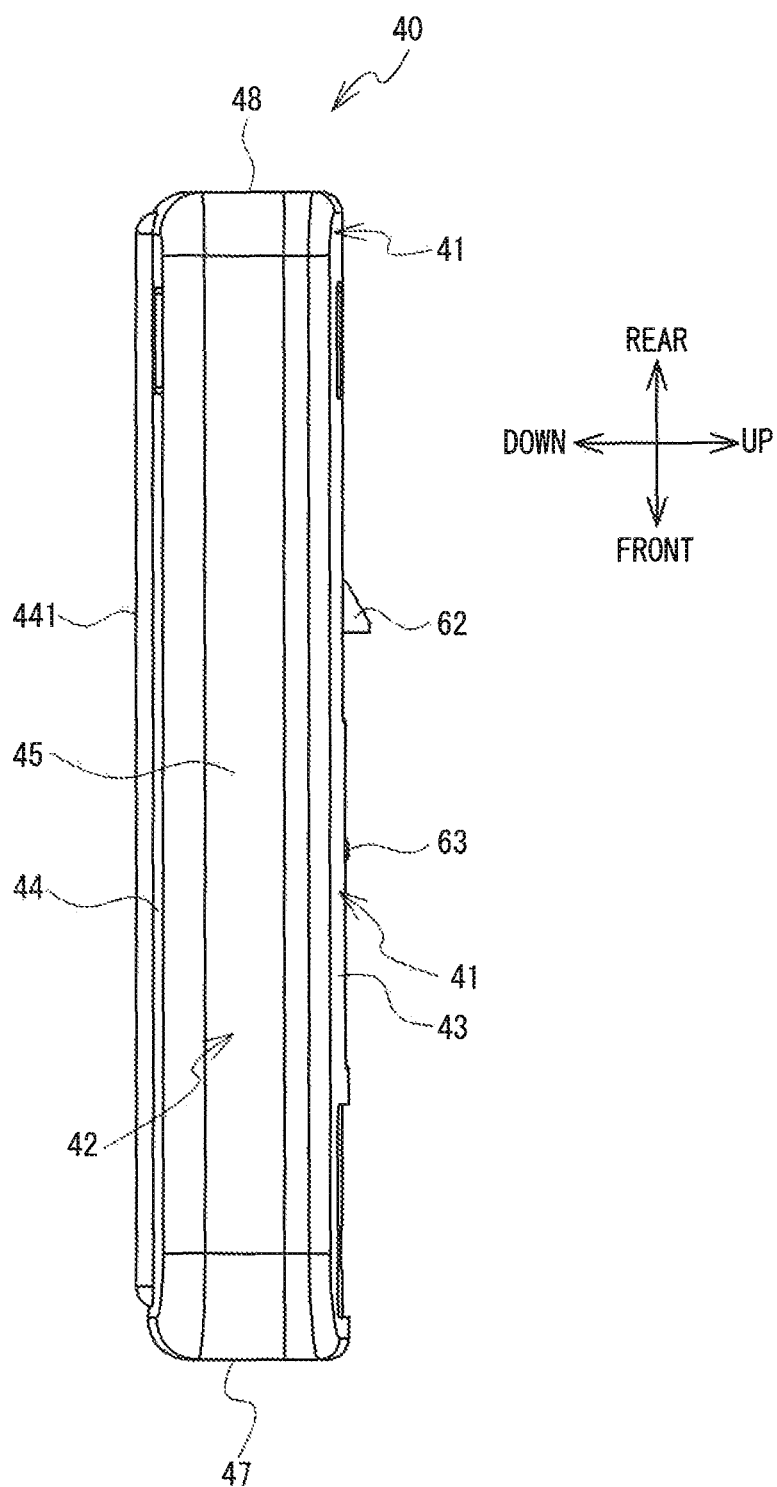
FIG. 8 is a left side view of the IC chip holder 40.
Figure 9:
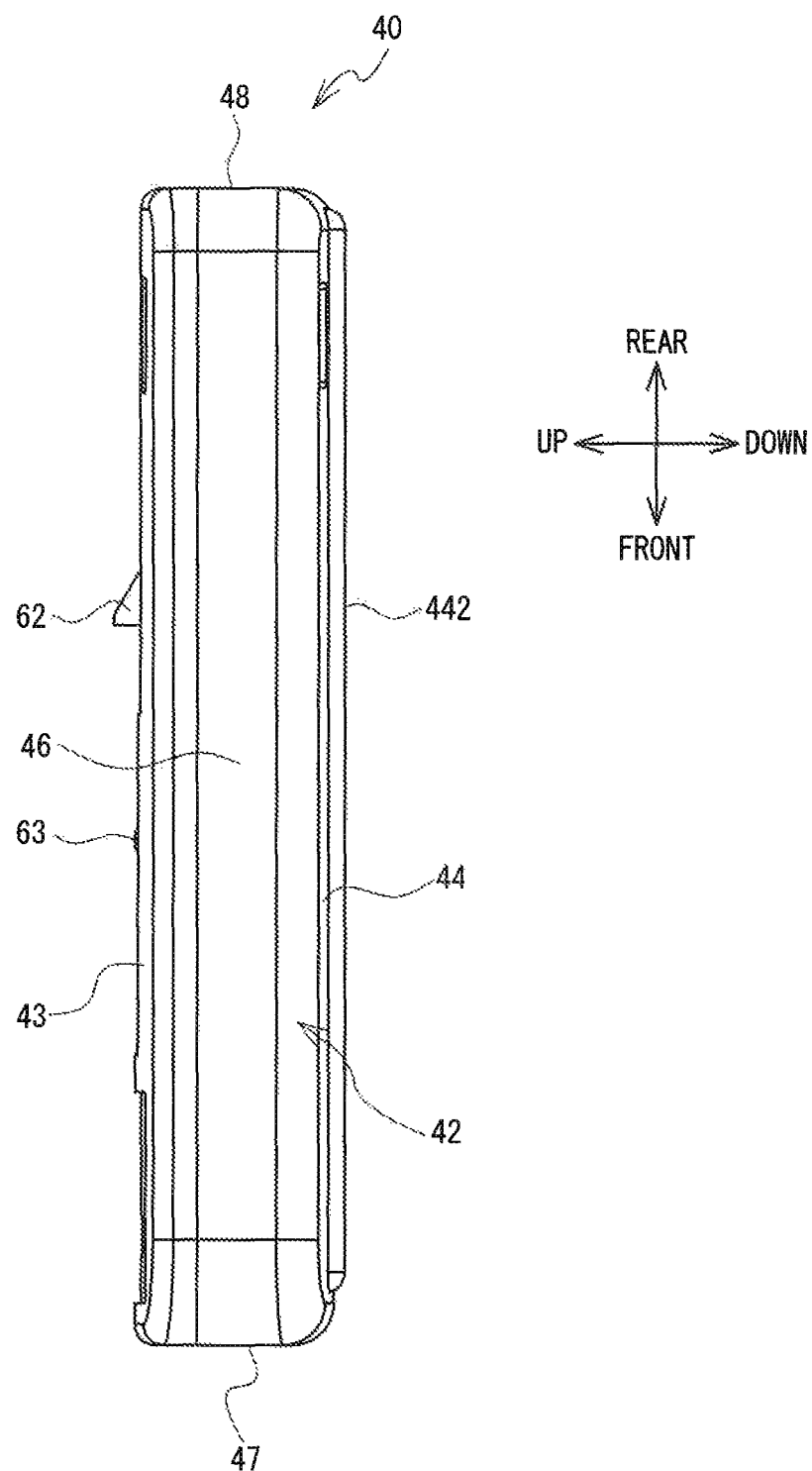
FIG. 9 is a right side view of the IC chip holder 40.

As shown in FIG. 8, the left side surface 45 is a substantially rectangular-shaped side surface that extends in the front-rear direction. As shown in FIG. 9, the right side surface 46 is also a substantially rectangular-shaped side surface that extends in the front-rear direction. As shown in FIG. 10, the back surface 48 is a barrel shape that is long in the left-right direction with upper and lower sides curved when viewed from the front-rear direction, and has the cut-out portion 435 on the upper side. As shown in FIG. 11, the front surface 47 is a barrel shape that is long in the left-right direction.

Insertion and Removal of IC Chip Holder 40

An explanation will be made of the insertion and removal of the IC chip holder 40 having the above-described structure into and from the chip writer 20. When the remaining amount of ink becomes low in any one of the tanks 7, the operation portion 14 displays a message of urging refilling of the ink. The user prepares an ink storage container (not shown in the drawings) storing the ink of the corresponding color. The IC chip holder 40 is attached to the ink storage container. Information relating to the color of the ink is stored in advance in the IC chip 70 of the IC chip holder 40. The user inserts the IC chip holder 40 into the opening 21A of the chip writer 20 so as to enter the rear end first. The user inserts the IC chip holder 40 into the opening 21A of the chip writer 20 against the urging force of the torsion spring 26. The protrusion 62 of the IC chip holder 40 is inclined, and at the time of initial insertion, the end portion on the leading insertion side of the protrusion 62 contacts the lower surface of the engagement portion 20B. Since the base portion 61 can be elastically deformed downward, as the IC chip holder 40 is inserted into the opening 21A, the protrusion 62 of the IC chip holder 40 descends along the lower surface of the engagement portion 20B. When the entire protrusion 62 descends lower than the lower surface of the engagement portion 20B, and the protrusion 62 passes through the opening 21A, the protrusion 62 is engaged with the engagement portion 20B, as shown in FIG. 4. Alternatively, the user may press the second protrusion 63 of the elastic deformation portion 60 using a finger. Thus, the elastic deformation portion 60 elastically deforms downward, and the protrusion 62 passes through the opening 21A. In any case, since the protrusion 62 is engaged with the engagement portion 20B, the IC chip holder 40 is hard to come off from the opening 21A. As shown in FIG. 4, after inserting the IC chip holder 40 into the opening 21A of the chip writer 20, when the user releases the pressing of the second protrusion 63, the protrusion 62 is engaged with the engagement portion 20B.

Next, the user removes a lid of an ink spout of the tank 7 to be filled with the ink, and fills the tank 7 with the ink from the ink storage container. The chip writer 20 writes amount of ink information from the remaining amount of ink sensor of the tank 7 that has been filled with the ink into the IC chip 70 of the IC chip holder 40. After that, in order to remove the IC chip holder 40 from the chip writer 20, when the user presses the second protrusion 63 and releases the engagement of the protrusion 62 with the engagement portion 20B. The IC chip holder 40 is pressed out from the chip writer 20 by an urging force of the torsion spring 26.

As described above, in the IC chip holder 40 of the present embodiment, the upper housing body 41 is provided with the elastic deformation portion 60 that is elastically deformable toward the inside of the upper housing body 41, on the side of the electric contacts 71, 72, and 73 of the IC chip 70. Thus, since the protrusion 62 of the elastic deformation portion 60 elastically deforms toward the inside of the upper housing body 41, if the IC chip holder 40 is dropped or collides with another object, the elastic deformation portion 60 bends and alleviates the impact. Thus, the possibility of the IC chip 70 being damaged can be reduced.

In addition, the upper housing body 41 is provided with the top surface 43 on the side on which the IC chip 70 is mounted, and with the protrusion 62 provided on the elastic deformation portion 60, and the protrusion 62 protrudes further to the outside than the top surface 43 of the upper housing body 41. Thus, if the IC chip holder 40 is dropped or collides with another object, the protrusion 62 of the elastic deformation portion 60 comes into contact with the other object before the top surface 43 of the upper housing body 41, and the elastic deformation portion 60 bends and alleviates the impact. Thus, the possibility of the IC chip 70 being damaged can be reduced.

Since the protrusion 62 is disposed further toward the center side of the upper housing body 41 than the electric contacts 71 to 73, the protrusion 62 can be disposed closed to the center of gravity that is the center of mass of the IC chip holder 40, and thus, if the IC chip holder 40 is dropped or collides with another object, the impact is alleviated.

The elastic deformation portion 60 is provided with the base portion 61 that is cantileveredly supported on the upper housing body 41, and the base portion 61 is disposed further to the inside than the top surface 43 of the upper housing body 41. Thus, since the base portion 61 of the elastic deformation portion 60 is positioned further to the inside than the top surface 43, the possibility of the cantileveredly supported the base portion 61 of the elastic deformation portion 60 being subject to the impact is reduced. As a result, in comparison to a case in which the base portion 61 of the elastic deformation portion 60 is the same height as the top surface 43 of the upper housing body 41, the possibility that the elastic deformation of the elastic deformation portion 60 functions normally can be maintained.

Since the top surface 43 that surrounds the base portion 61 is a surface portion, the impact on the base portion 61 of the elastic deformation portion 60 is reduced.

The base portion 61 has the level difference 10 with the top surface 43. Thus, by a finger being applied to the top surface of the base portion 61 that has the level difference 10 and causing the elastic deformation portion 60 to elastically deform. Thus, the possibility is reduced of the finger touching the electric contacts 71 to 73 of the IC chip 70.

In the elastic deformation portion 60, the second protrusion 63 that protrudes in the same direction as the protrusion 62 is provided between the protrusion 62 and the base portion 61. Thus, by the finger being applied to the second protrusion 63 and causing the elastic deformation portion 60 to elastically deform. Thus, the possibility is reduced of the finger touching the electric contacts 71 to 73 of the IC chip 70.

The upper housing body 41 is configured by a plurality of components, and one of the components configuring the upper housing body 41 is an integrated component provided with an elastic deformation portion. Thus, in comparison to a case in which the elastic deformation portion 60 is provided separately from the upper housing body 41, it is possible to prevent forgetting to fix the elastic deformation portion 60 to the upper housing body 41 at the time of assembling the IC chip holder 40 or the like.

The elastic deformation portion 60 is provided in the housing body 41 with the space 436 between the bottom surface 64 and the lower housing body 42. The top surface 43 surrounds at least a part 436A of the space 436 exposed between the top surface 43 and the elastic deformation portion 60. Thus, the possibility of a foreign object that obstructs the elastic deformation of the elastic deformation portion 60, which elastically deforms into the space 436, entering into the space 436 is reduced.

The electric contacts 71 to 73 of the IC chip 70 are provided in positions lower than the top surface 43 of the upper housing body 41. Thus, the possibility is reduced of a finger touching the electric contacts 71 to 73 of the IC chip 70.

On the side on which the IC chip 70 is mounted, the protrusion 62 of the elastic deformation portion 60 protrudes further to the outside than the top surface 43 of the upper housing body 41. Thus, the protrusion 62 of the elastic deformation portion 60 comes into contact with another object in advance of the top surface 43 of the upper housing body 41. Therefore, if the IC chip holder 40 is dropped or collides with the other object, the elastic deformation portion 60 can bend and alleviate the impact. Thus, the possibility of the IC chip 70 being damaged is reduced.

Since the impact is alleviated as described above, even when the IC chip 70 stores the information relating to the ink, the possibility is reduced of the information relating to the ink being lost through damage to the IC chip 70. The IC chip holder 40 can be inserted into and removed from the printer 1, and thus, even if the IC chip holder 40 is dropped when the IC chip holder 40 is inserted into or removed from the printer 1, the possibility of the IC chip 70 being damaged is reduced. The upper housing body 41 is an example of a "housing body" of the present invention.

Figure 16:
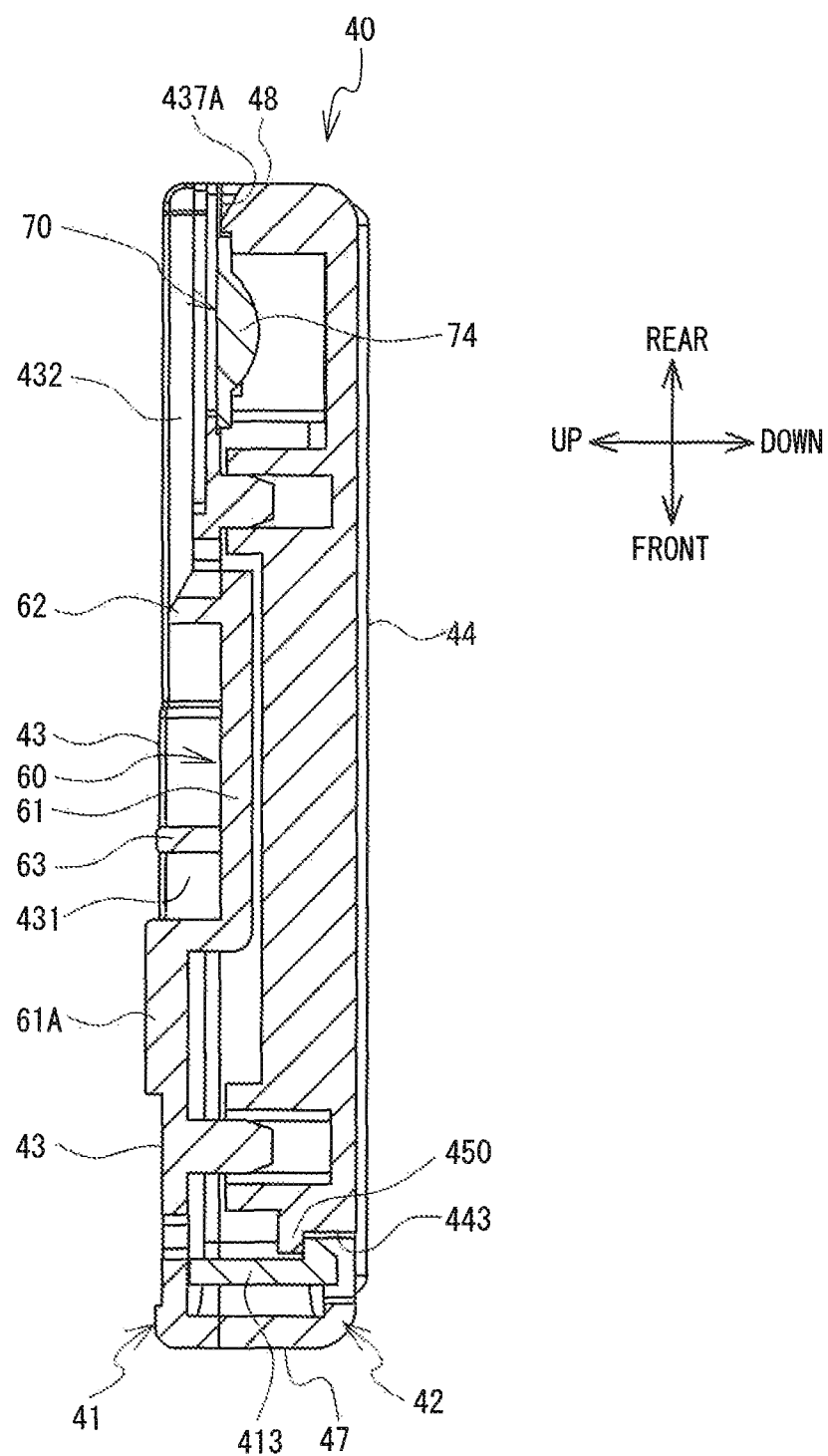
FIG. 16 is a cross-sectional view of a modified example.

The present invention is not limited to the above-described embodiment, and various changes are possible insofar as they do not depart from the scope and spirit of the present invention. For example, as shown in FIG. 16, an end portion 61A on the front side of the base portion 61 of the elastic deformation portion 60 may protrude further above (to the outside of) the top surface 43 of the upper housing body 41, and the protrusion 62 may be lower than the top surface 43 of the upper housing body 41. If the IC chip holder 40 is dropped or collides with another object, the end portion 61A makes contact, the elastic deformation portion 60 bends, and the impact is alleviated. As a result, the possibility of the IC chip 70 being damage is reduced. Furthermore, the possibility of losing the information relating to the ink stored in the IC chip 70 is reduced. The chip writer 20 may be a reader/writer that not only writes information into the IC chip 70 of the IC chip holder 40 but is also provided with a function to read out information from the IC chip 70.

The apparatus and methods described above with reference to the various embodiments are merely examples. It goes without saying that they are not confined to the depicted embodiments. While various features have been described in conjunction with the examples outlined above, various alternatives, modifications, variations, and/or improvements of those features and/or examples may be possible. Accordingly, the examples, as set forth above, are intended to be illustrative. Various changes may be made without departing from the broad spirit and scope of the underlying principles.

What is claimed is:

1. IC chip holder configured for removable insertion into a chip writer unit provided on a printer having one or more ink tanks refillable, the IC chip holder being further configured to be attached to, and detached from, an ink storage container for filling the one or more ink tanks of the printer with ink, the IC chip holder comprising:
a housing body configured to mount an IC Chip, the housing body having:
a top surface;
a side surface; and
an elastic deformation portion configured to elastically deform toward the inside of the housing body as a direction of elastic deformation, the elastic deformation portion having a protrusion protruding further to the outside than the top surface of the housing body, the elastic deformation portion being positioned between a portion configured to mount an IC Chip and the side surface in a first direction, the top surface being positioned with respect to the elastic deformation portion in a second direction perpendicular to the first direction and the direction of the elastic deformation,
wherein a length of the housing body in the direction of the elastic deformation is less than a length of the housing body in the first direction and less than a length of the housing body in the second direction.

2. The IC chip holder according to claim 1, wherein the elastic deformation portion is provided with a base portion cantileveredly supported by the housing body.

3. The IC chip holder according to claim 2, wherein the base portion is positioned further to the inside than the top surface.

4. The IC chip holder according to claim 1, wherein the elastic deformation portion is separated from the top surface in the second direction.

5. The IC chip holder according to claim 1, wherein the top surface is positioned further to the outside the portion configured to mount an IC Chip.

6. The IC chip holder according to claim 1 further comprising a second protrusion is provided on the elastic deformation portion and is positioned between the protrusion and the side surface.

7. The IC chip holder according to claim 1, wherein the protrusion having a first surface and a second surface, the first surface being perpendicular to the first direction, the second surface being positioned between the portion configured to mount an IC Chip and the first surface in the first direction.

8. The IC chip holder according to claim 1, wherein the protrusion having a first surface and a second surface, the first surface configured to engage, when the IC chip holder is inserted into the chip writer unit, with an engagement portion of the chip writer unit, the second surface being positioned between the portion configured to mount an IC Chip and the first surface in the first direction.

9. The IC chip holder according to claim 1, wherein the protrusion having an inclined surface positioned an on a distal end of the protrusion in the second direction, the inclined surface inclining toward the portion configured to mount an IC Chip.

10. The IC chip holder according to claim 1 further comprising the IC chip mounted in the housing body.

11. IC chip holder configured for removable insertion into a chip writer unit provided on a printer having one or more ink tanks refillable, the IC chip holder being further configured to be attached to, and detached from, an ink storage container for filling the one or more ink tanks of the printer with ink, the IC chip holder comprising:
a housing body configured to mount an IC Chip, the housing body having:
a top surface;
a side surface; and
an elastic deformation portion configured to elastically deform toward the inside of the housing body, the elastic deformation portion having a protrusion protruding further to the outside than the top surface of the housing body, the elastic deformation portion being positioned between a portion configured to mount an IC Chip and the side surface in a first direction, the top surface being positioned in a second direction perpendicular to the first direction with respect to the elastic deformation portion, wherein
a second protrusion is provided on the elastic deformation portion and is positioned between the protrusion and the side surface.

* * * * *